US010473738B2

(12) United States Patent
Duensing et al.

(10) Patent No.: US 10,473,738 B2
(45) Date of Patent: Nov. 12, 2019

(54) WIRELESS-TYPE RF COIL APPARATUS COMPRISING AN RF TRANSDUCER ARRAY AND A MAGNETIC FIELD PROBE ARRAY

(71) Applicant: KONINKLIJKE PHILIPS N.V., Eindhoven (NL)

(72) Inventors: George Randall Duensing, Eindhoven (NL); Arne Reykowski, Eindhoven (NL); Charles Saylor, Eindhoven (NL)

(73) Assignee: Koninklijke Philips N.V., Eindhoven (NL)

(*) Notice: Subject to any disclaimer, the term of this patent is extended or adjusted under 35 U.S.C. 154(b) by 122 days.

(21) Appl. No.: 15/562,049

(22) PCT Filed: Mar. 24, 2016

(86) PCT No.: PCT/IB2016/051664
§ 371 (c)(1),
(2) Date: Sep. 27, 2017

(87) PCT Pub. No.: WO2016/157039
PCT Pub. Date: Oct. 6, 2016

(65) Prior Publication Data
US 2018/0106875 A1 Apr. 19, 2018

Related U.S. Application Data

(60) Provisional application No. 62/140,788, filed on Mar. 31, 2015.

(51) Int. Cl.
*G01R 33/36* (2006.01)
*G01R 33/565* (2006.01)
(Continued)

(52) U.S. Cl.
CPC ....... *G01R 33/3692* (2013.01); *G01R 33/341* (2013.01); *G01R 33/4818* (2013.01);
(Continued)

(58) Field of Classification Search
CPC ............ G01R 33/3692; G01R 33/5619; G01R 33/4818; G01R 33/341; G01R 33/56572; G01R 33/58; G01R 33/56563
See application file for complete search history.

(56) References Cited

U.S. PATENT DOCUMENTS 5,384,536 A  1/1995 Murakami et al.
7,208,951 B2  4/2007 Pruessmann et al.
(Continued)

OTHER PUBLICATIONS

Barmet et al "A Transmit/Receive System for Magnetic Field Monitoring of In Vivo MRI" Magnetic Resonance in Medicine, vol. 62, No. 1 Jul. 1, 2009 p. 269-276.

*Primary Examiner* — G. M. A Hyder (57) ABSTRACT

A system for controlling a wireless-type radio frequency (RF) coil apparatus (102, 202, 302, 500) for a magnetic resonance (MR) system including a processor for acquiring emitted radio frequency (RF) signals from a plurality of coils of an RF transducer array including an indication of a local clock signal indicating a time of (RF) signal acquisition; acquiring magnetic field strength information from a plurality of field probes of a magnetic field probe array including an indication of the local clock signal indicating a time of magnetic field strength information acquisition, and forming k-space information based upon the acquired emitted RF signals from the plurality of coils of the RF transducer array and the acquired magnetic field strength information including the indications of the local clock signal.

18 Claims, 5 Drawing Sheets

(51) Int. Cl.
*G01R 33/58* (2006.01)
*G01R 33/341* (2006.01)
*G01R 33/48* (2006.01)
*G01R 33/561* (2006.01)

(52) U.S. Cl.
CPC ... *G01R 33/5619* (2013.01); *G01R 33/56572* (2013.01); *G01R 33/58* (2013.01); *G01R 33/56563* (2013.01)

(56) References Cited

U.S. PATENT DOCUMENTS

| | | |
|---|---|---|
| 2010/0117649 A1 | 5/2010 | Nakanishi et al. |
| 2010/0308826 A1 | 12/2010 | Saes et al. |
| 2013/0271126 A1 | 10/2013 | Griswold et al. |
| 2014/0266201 A1 | 9/2014 | Fuderer et al. |
| 2014/0327438 A1* | 11/2014 | Barmet ............ G01R 33/24 324/301 |
| 2018/0321335 A1* | 11/2018 | Gross ............ G01R 33/24 |

* cited by examiner

WIRELESS-TYPE RF COIL APPARATUS COMPRISING AN RF TRANSDUCER ARRAY AND A MAGNETIC FIELD PROBE ARRAY

CROSS REFERENCE TO RELATED APPLICATIONS

This application is a U.S. national phase application of International Application No. PCT/IB2016/051664, filed on Mar. 24, 2016, which claims the benefit of U.S. provisional Application Ser. No. 62/140,788 filed on Mar. 31, 2015 and is incorporated herein by reference.

The present system relates to a k-space state machine for magnetic resonance (MR) imaging (MRI) and spectroscopy (MRS) systems and, more particularly, to a wireless radio-frequency (RF) coil having a mobile k-space state machine for MRI and MRS systems and a method of operation thereof.

MRI is an imaging technique that uses frequency and phase encoding of protons for image reconstruction. Recently, wireless-type receiving coils such as radio-frequency (RF) coils (which may also be known as wireless-type or receive-only-type RF coils or the like) have become available. These wireless-type RF coils rely upon accurate synchronization (e.g., often on the order of picoseconds which makes for a challenging system of wireless clock delivery and recovery) of its local clock with a system clock of the MRI system to properly time signal acquisition to corresponding excitations for reconstruction. In other words, conventional reconstruction techniques require information related to an analog signal as well as a corresponding system clock to form corresponding k-space data. Unfortunately, wireless-type RF coils are difficult to properly synchronize with a system clock and, if synchronization is inaccurate, undesirable image degradation due to artifacts, and the like can occur In order to be truly wireless, the clock signal must be sent wirelessly as well. The channel the wireless signals pass through (the MR system bore, patient, accessories, etc.) may cause changes in phase of the recovered clock that is time dependent thus causing signal degradation. Further, many MRI systems use proprietary synchronization methods that vary based upon manufacturer. Accordingly, it would be difficult, or nearly impossible for wireless-type RF coil that lacks these proprietary methods (e.g. such as a wireless-type RF coil manufactured by a different manufacturer than the manufacturer of the MRI system) to synchronize with the MRI clock. Accordingly, users of existing MRI systems may only select from conventional wireless-type coils that are manufactured by the same or a licensed manufacturer. Further, as MRI systems typically store data acquired during diagnostic procedures on a local memory, this data may not be accessible absent the MRI system and corresponding data access or use charges. Accordingly, embodiments of the present system may overcome these and/or other disadvantages in the prior art systems.

The system(s), device(s), method(s), arrangements(s), user interface(s), computer program(s), processes, etc. (hereinafter each of which will be referred to as system, unless the context indicates otherwise), described herein may address problems in prior art systems.

In accordance with embodiments of the present system, there is disclosed a wireless-type radio frequency (RF) coil apparatus for a magnetic resonance (MR) system, the wireless-type RF coil apparatus including one or more of an RF transducer array, comprising a plurality of coils tuned to acquire emitted RF signals from an object of interest (OOI) within a scanning volume when subject to MR encoding signals; a magnetic field probe array comprising a plurality of field probes tuned to acquire magnetic field information of dynamic encoding fields within the scanning volume; a local clock configured to produce a local clock signal; and at least one controller which acquires emitted radio frequency (RF) signals from the plurality of coils of the RF transducer array including an indication of the local clock signal indicating a time of (RF) signal acquisition, acquires magnetic field strength information from the plurality of field probes of the magnetic field probe array including an indication of the local clock signal indicating a time of magnetic field strength information acquisition, and forms k-space information based upon the acquired emitted RF signals from the plurality of coils of the RF transducer array and the acquired magnetic field strength information including the indications of the local clock signal.

The at least one controller may form the k-space information utilizing the indications of the local clock signal independently of a clock and without synchronization with a system clock of MR system that emits the RF signals and the magnetic field. The at least one controller may reconstruct an image based upon the k-space information. The at least one controller may repeatedly perform the acquisitions at sampling times (ts) of the local clock.

In accordance with embodiments of the present system, prior to forming the k-space information, the at least one controller may digitize the acquired emitted RF signals and the acquired magnetic field strength information. When forming the k-space information, the at least one controller may determine encoding functions of the MRI system based upon the acquired magnetic field strength information. The at least one controller may time-stamp the digitized acquired magnetic field strength information. The plurality of field strength probes may be situated in substantially close proximity to the RF transducer array. The plurality of field strength probes may surround the RF transducer array.

In accordance with embodiments of the present system, there is disclosed a method of controlling a wireless-type radio frequency (RF) coil apparatus for a magnetic resonance (MR) system, the method comprising acts performed by at least one processor including one or more of acquiring emitted radio frequency (RF) signals from a plurality of coils of an RF transducer array including an indication of a local clock signal indicating a time of (RF) signal acquisition; acquiring magnetic field strength information from a plurality of field probes of a magnetic field probe array including an indication of the local clock signal indicating a time of magnetic field strength information acquisition; and forming k-space information based upon the acquired emitted RF signals from the plurality of coils of the RF transducer array and the acquired magnetic field strength information including the indications of the local clock signal.

The method may include one or more of forming the k-space information utilizing the indications of the local clock signal independent of and without synchronization with a system clock of MR system that emits the RF signals and the magnetic field, reconstructing an image based upon the k-space information and repeatedly performing the acquisitions at sampling times (ts) of the local clock. Prior to forming the k-space information, the method may include digitizing the acquired emitted RF signals and the acquired magnetic field strength information. When forming the k-space information, the method may include one or more of encoding functions of the MRI system based upon the acquired magnetic field strength information and time-stamping the digitized acquired magnetic field strength information. The plurality of field strength probes may be positioned in substantially close proximity to the RF transducer array. The plurality of field strength probes may be positioned to surround the RF transducer array.

In accordance with embodiments of the present system, there is disclosed a computer readable non-transitory medium having computer readable program code for operating on a wireless-type radio frequency (RF) coil apparatus for performing a method of operating the wireless-type radio frequency (RF) coil apparatus including one or more acts of acquiring emitted radio frequency (RF) signals from a plurality of coils of an RF transducer array including an indication of a local clock signal indicating a time of (RF) signal acquisition; acquiring magnetic field strength information from a plurality of field probes of a magnetic field probe array including an indication of the local clock signal indicating a time of magnetic field strength information acquisition; and forming k-space information based upon the acquired emitted RF signals from the plurality of coils of the RF transducer array and the acquired magnetic field strength information including the indications of the local clock signal.

The present invention is explained in further detail in the following exemplary embodiments and with reference to the figures, where identical or similar elements are partly indicated by the same or similar reference numerals, and the features of various exemplary embodiments being combinable. In the drawings.

The following are descriptions of illustrative embodiments that when taken in conjunction with the following drawings will demonstrate the above noted features and advantages, as well as further ones. In the following description, for purposes of explanation rather than limitation, illustrative details are set forth such as architecture, interfaces, techniques, element attributes, etc. However, it will be apparent to those of ordinary skill in the art that other embodiments that depart from these details would still be understood to be within the scope of the appended claims. Moreover, for the purpose of clarity, detailed descriptions of well known devices, circuits, tools, techniques, and methods are omitted so as not to obscure the description of the present system. It should be expressly understood that the drawings are included for illustrative purposes and do not represent the entire scope of the present system. In the accompanying drawings, like reference numbers in different drawings may designate similar elements. The term and/or and formatives thereof should be understood to mean that only one or more of the recited elements may need to be suitably present (e.g., only one recited element is present, two of the recited elements may be present, etc., up to all of the recited elements may be present) in a system in accordance with the claims recitation and in accordance with one or more embodiments of the present system.

Figure 1:
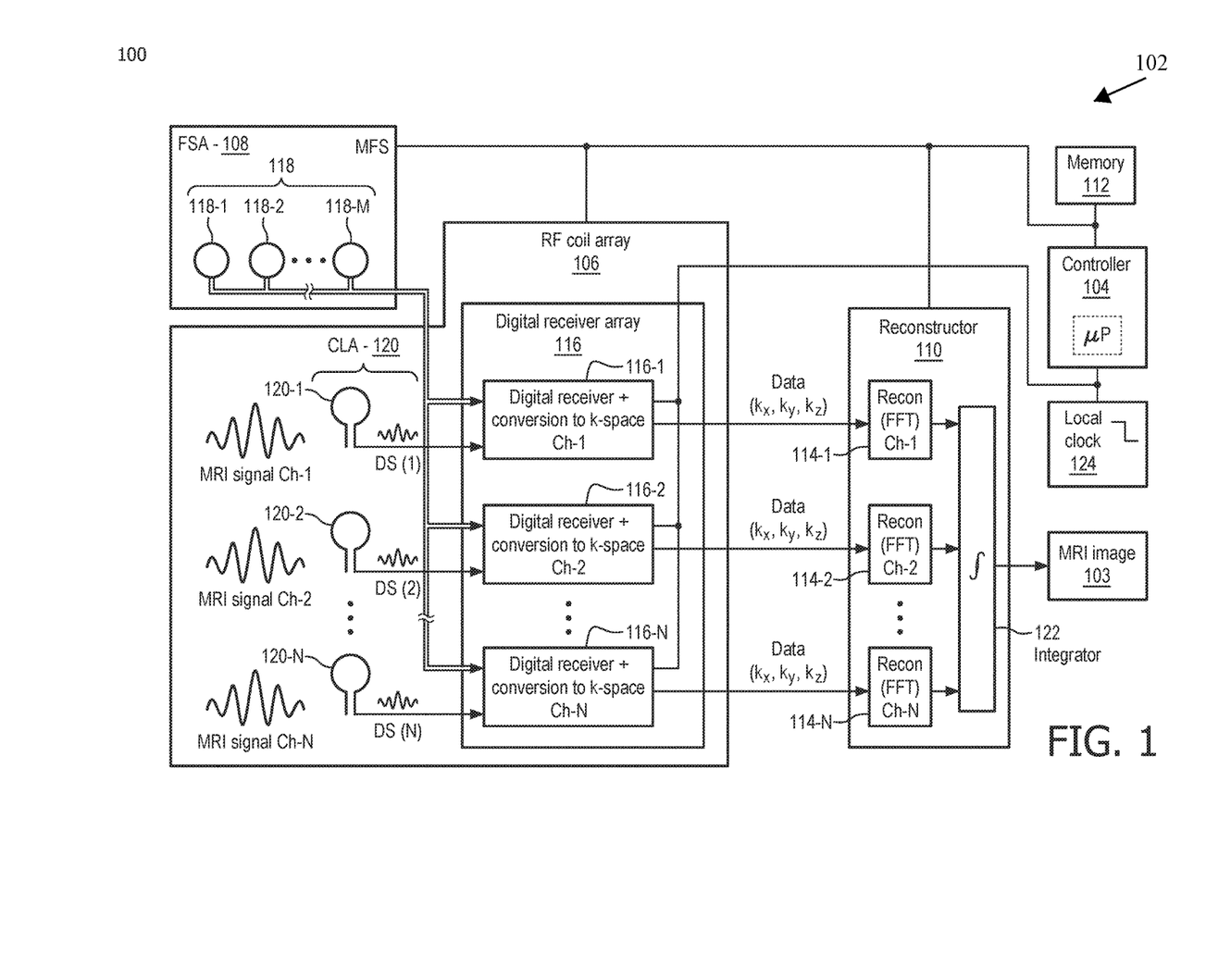
FIG. 1 shows a schematic block diagram of a portion of a wireless-type RF coil portion operating in accordance with embodiments of the present system.

FIG. 1 shows a schematic block diagram 100 of a portion of a RF coil portion 102 (hereinafter wireless RFC or simply RFC) operating in accordance with embodiments of the present system. The RFC 102 may include a controller 104, a local clock 124, an RF coil array 106, a field-strength array (FSA) 108, a reconstructor 110, and a memory 112. For the sake of clarity, it will be assumed that the RFC 102 may include a plurality of channels (Ch) such as N channels, where N is an integer.

The controller 104 may control the overall operation of the RFC 102 in accordance with embodiments of the present system. Further, the controller 104 may communicate with one or more external devices using any suitable communication method or methods such as wired and/or wireless communication methods. For example, the controller 104 may communicate with a communication device of a user and/or a controller of an MRI system in which the RFC 104 is being used to transmit diagnostic data such as MRI images, raw data, spectrographic data, settings, etc. The RFC 102 may include wired and/or wireless-type RFCs as may be desired. Further, the RFC 102 may include receive-only and/or transmit/receive RFCs as may be desired. However, for the sake of simplifying the discussion, a wireless-type receive-only RFC is discussed. It should be understood that the discussion is also applicable regarding a transmit/receive RFC.

Moreover, for the sake of simplifying the discussion, the RFC 102 is described in an environment of detecting encoding fields within a scanning volume of an MRI system in which an object-of-interest (OOI) such as a patient is located. The MRI system may be operative to encode (e.g., using encoding fields (e.g., by emitting RF excitation (e.g., $B_1$) and gradient (G) fields) the scanning volume while generating a main magnetic field ($B_0$) through the scanning volume. The MRI system may be operating using a system clock which may be different from the local clock 124.

The local clock 124 may be a free-running but stable clock that may operate independently of a system clock (e.g., of an MRI system in which the RFC 102 is being used) and output a clock signal (CLK).

The FSA 108 may include a sensor array 118 which may include a plurality of field sensor probes 118-1 through 118-M (generally 118-M) (where M is an integer) which may detect magnetic fields at each probe location and form corresponding magnetic field strength signals (MFSs) which may indicate a magnetic field at each of the plurality of field sensor probes 118-M. For example, the field sensor probes 118-M may detect the magnetic field, such as the transient magnetic field emitted by an MRI system.

Suitable field sensor probes may be available for example from the Skope Magnetic Resonance Technologies, LLC, Zurich, Switzerland. The field sensor probes 118-M may be distributed at predetermined locations throughout the RFC 104 and may provide gradient field (Gr) and/or RF (e.g., $B_1$) field information in one or more axes such as x, y, and/or z axes and may generate a corresponding MFS signal or signals. For the sake of clarity, it will be assumed that M may equal N in the present embodiments. However, in yet other embodiments, M may be different from N. For example, M may be greater than N. As desired, the MFSs may be time stamped to identify a sample such as a current sample in accordance with the local clock 124 or may be otherwise indexed (e.g., serially by sample number such as using an index (i), where i may be an integer and may start at 1 to indicate a first sample and subsequently be incremented to indicate a next sample, etc.). In the present system, it may be assumed that each channel may include 6 MFSs such as a $G_x$, $G_y$, $G_z$, and $B_1$ MFSs. For example, Bo(t) is sampled resulting in RF transmit and gradients being measured. As the sensors are outside of the tissue being imaged, interpolation of the field within the object is performed using the external measurements. In accordance with embodiments of the present system, sampling may occur essentially constantly during acquisition. All three dimensions may be measured, but RF typically only needs to be in x, y and gradients typically only need to be in z directions. Many different sensor technologies may be suitably employed in accordance with embodiments of the present system, the details of which are beyond the scope of the present system other than to appreciate that such systems may be employed in accordance with embodiments of the present system.

The RF coil array 106 may include a coil loop array (CLA) 120 comprising a plurality of receive coils 120-1 through 120-N (generally 120-N) and a digital receiver array 116 comprising a plurality of receivers 116-1 through 116-N, for example at least one for each of the N channels though different combinations are also conceived within embodiments of the present system. The receive coils 120-N may be tuned to receive emitted radio-frequency signals (ERFS) from an object-of-interest (OOI) (e.g., a patient being scanned using MR techniques in accordance with embodiments of the present system) and form a corresponding signal such as an analog signal which may be referred to generally as a detected signal (DS). The DS for each $n^{th}$ channel may be referred to as DS(n). Thus, each of the N channels may have at least one corresponding DS. For example, channel 1 may acquire a DS(1), and channel 2 may acquire DS(2) and the channel N may acquire DS(N).

With regard to the receive coils 120-N, in accordance with embodiments of the present system each of these receive coils may be tuned to a desired MR frequency such as a resonant frequency of one or more desired nuclear species such as $^1H$, $^{13}C$, $^{31}P$, $^{23}Na$, $^{19}F$ at a desired main magnetic field ($B_0$) T. In accordance with embodiments of the present system, the DSs for one or more channels may be time stamped for example when acquired in accordance with the local clock 124 or otherwise indexed (e.g., serially by sample number), as desired. For example, for each $n^{th}$ channel, a DS may be time stamped with an acquisition time determined by the local clock which, as stated above, is a free-running clock and may be assumed to differ and or otherwise be timed independent from the system clock. In accordance with the same or further embodiments of the present system, the DSs may for example be indexed sequentially in time as acquired/provided.

The digital receiver array 116 may include a plurality of digital receivers 116-1 through 116-N (generally 116-n) one of each of which may be associated with an $n^{th}$ channel of the N channels. Each digital receiver 116-n may be coupled to at least one receive coil 120-N and to a corresponding field sensor probe 118-M so as to receive the DSs and the corresponding MFSs. More particularly, each digital receiver 116-n may sample the DSs and the MFSs for example synchronously, substantially synchronously and/or sequentially with regard to each other at given sampling times and convert these signals to corresponding k-space information ($k_x$, $k_y$, $k_z$). In accordance with embodiments of the present system, any suitable data format with a consistent time-stamp from the local clock signal (e.g., clock 124, 224, 352, etc.) may be utilized. In accordance with embodiments of the present system, by utilizing the sampled MFSs together with corresponding DSs, errors that might otherwise be provided by differences between intended and resultant MFSs may be eliminated in the conversion of these signals to the corresponding k-space information. The k-space information may be time stamped in accordance with the local clock 124 and or otherwise indexed (e.g., serially by sample number), as desired. In accordance with embodiments, the local clock 124 may be utilized for timing the sampling times of the digital receivers 116-n.

With regard to encoding, the system through operation of the field sensor probes 118-M may detect RF and magnetic fields (e.g., gradient fields) which are output by an MRI system for encoding a region-of-interest. Therefore by sampling these encoding fields, such as continuously, and/or otherwise repeatedly, these fields may be tracked in real time and valuable data extracted during, for example, reconstruction. In accordance with embodiments of the present system, this data may obviate the need for local and system clock synchronization. Further, embodiments of the present system may estimate the encoding fields emitted by an MRI system towards the region-of-interest (ROI) using interpolation techniques and the like as desired, such as to compensate for any missing field data. Accordingly, the encoding of data may be determined independent of the system which produces the encoding. In other words, in accordance with embodiments of the present system, the electromagnetic emissions from an MRI system towards a ROI, such as transient emissions (e.g., RF), may be detected and precisely determined and/or estimated without interacting with the MRI.

In accordance with embodiments of the present system, the reconstructor 110 may include a plurality of reconstruction portions 114-1 through 114-N (generally 114-n) illustratively shown with one of each shown associated with an $n^{th}$ channel of the N channels similarly to the digital receivers 116-n. Each reconstruction portion 114-n may be coupled to a corresponding digital receiver 116-n for the corresponding channel so as to receive a corresponding k-space data stream and generate image data for the corresponding channel using any suitable reconstruction method such as a Fast-Fourier-Transform (FFT) method. The image data for each channel may then be integrated by the integrator 122 to form a reconstructed image or images such as MRI image 103. The reconstructed image may then be rendered on a display, transmitted to a desired location (e.g., an external medical record database, a user's server, a memory of the MRI system, etc.) and/or a desired recipient (e.g., a medical professionals email address, a website, etc.), and/or may be stored in a memory of the RF coil 102 such as the memory 112. It is also envisioned that information generated by the RFC 102 such as such as the k-space information may be stored in a memory of the system such as the memory 112 for later use and/or transmitted to a desired location, recipient, etc.

Figure 2:
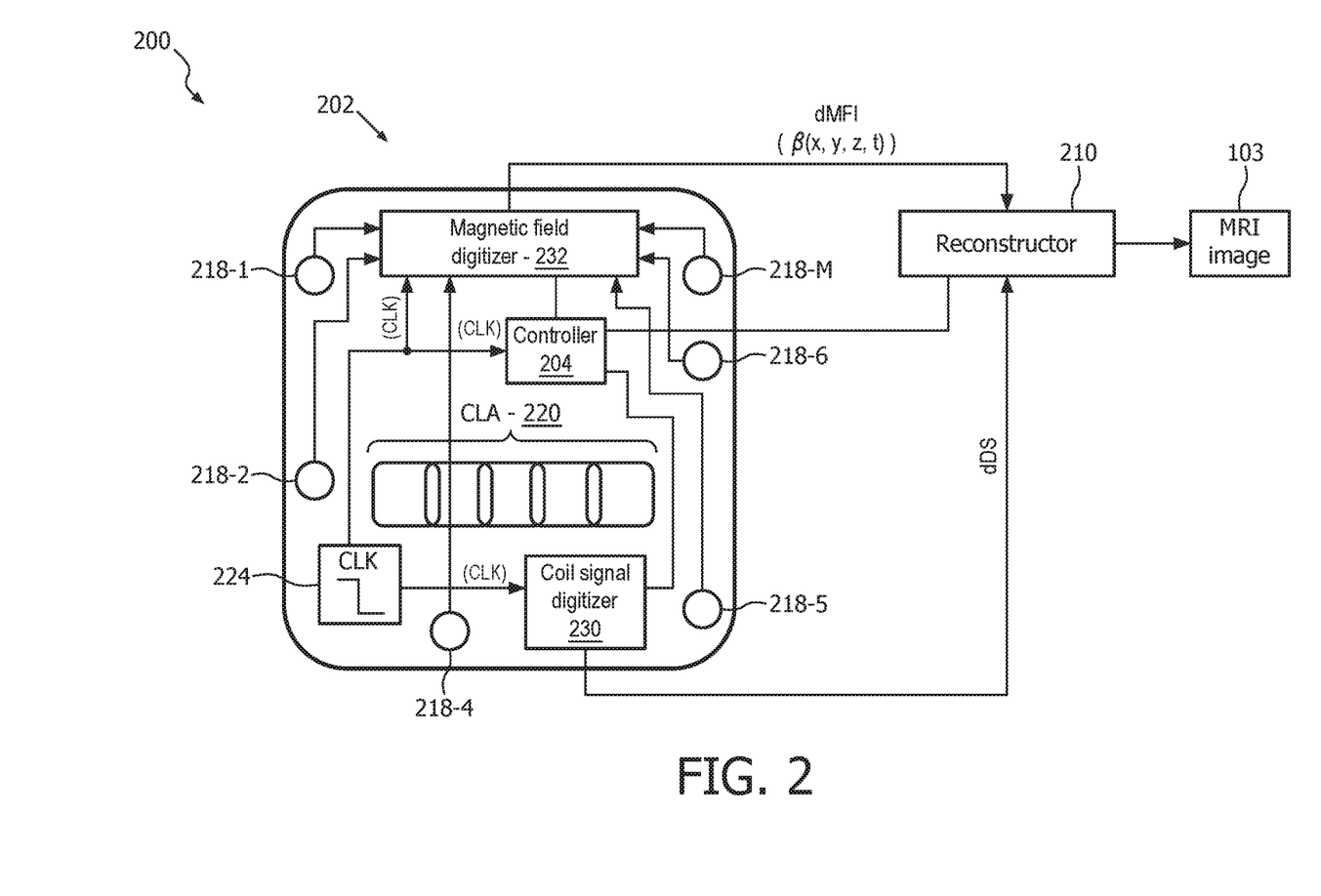
FIG. 2 shows a schematic block diagram of a portion of an RF coil operating in accordance with embodiments of the present system.

FIG. 2 shows a schematic block diagram 200 of a portion of a wireless-type RF coil 202 operating in accordance with embodiments of the present system. The system 202 may be similar to the system 102 and may include a controller 204, a plurality of field sensor probes 218-1 through 218-M (generally 218-M), a reconstructor 210, a CLA 220, a coil signal digitizer 230, a magnetic field digitizer 232, and a clock 224. The RF coil 202 may include a plurality of channels such as N channels. The controller 204 may be programmed to control (e.g., from instructions stored in a memory) the overall operation of the wireless-type RF coil 202 in accordance with embodiments of the present system.

The local clock 224 may be similar to the clock 124 and may be a clock that produces a clock signal that is independent of a system clock such as a system clock of an MRI system. In accordance with embodiments of the present system, the clock 224 may be coupled to the magnetic field digitizer 232 and the coil signal digitizer 230. Similarly, to the clock 124, the clock 224 may output a clock signal (CLK) as shown.

The CLA 220 may be similar to the CLA 120 and may include a plurality of receive coils which may receive emitted RF signals from an OOI being scanned (e.g., using nuclear MR methods) and form corresponding detected signals DSs. These DSs may then be provided to the coil signal digitizer 230 coupled thereto for digitization. Each receive coil may be associated with a corresponding channel of N channels.

The coil signal digitizer 230 may include at least one analog-to-digital (A/D) converter which may sample and digitize the DSs provided thereto and may output a corresponding digitized DS (dDS). In accordance with embodiments of the present system, the coil signal digitizer 230 may include an A/D for each $n^{th}$ channel for the N channels. Thus, the coil signal digitizer 230 may for example include N A/Ds in this illustration. Each of the A/Ds may be coupled to a corresponding coil or coils so as to sample the DSs for the coil or coils coupled thereto at sampling times (ts). In accordance with embodiments of the present system, the sampling may be performed continuously. In accordance with embodiments of the present system, these sampling times (ts) may be determined for example based upon the output of the clock 224. For example, in accordance with embodiments of the present system, RF signals may be sampled at rates in the 10 MHz to 100 MHz range. In accordance with further embodiments, the sample rate may be selected to just exceed the bandpass Nyquist rate or more. The MFSs may be sampled at lower rates, at least in some cases, but they may also be sampled at the same rates as DSs.

The magnetic field digitizer 232 may receive the MFSs from the field sensor probes 218-M and may sample and digitize this information and output corresponding digitized MFS (dMFS) which may include information related to magnetic field measurements (such as the Gr and/or $B_0$ fields such as field encoding) at each of the plurality of probes 218-M over the RF coil 200 at each sampling time (ts). Thus, the dMFS may include magnetic field measurement information $\vec{B}(x,y,z,t)$ for each sampling time (ts) for one or more magnetic fields such as the Gr and/or $B_0$ fields. The magnetic field digitizer 2232 may then provide the dMFS to the reconstructor 210.

In accordance with embodiments of the present system the MFSs and the DSs may be sampled synchronously, substantially synchronously and/or sequentially with regard to each other at sampling times (ts). Thus, the field sensor probes 218-M and/or the CLA 220 coils may be sampled synchronously, substantially synchronously and/or sequentially with regard to each other. Further, the MFSs and the DSs samples may be time stamped with respect to each other by a common clock time as described.

The reconstructor 210 may receive the dMFS from the magnetic field digitizer 232 and the dDS from the coil signal digitizer and reconstruct an image (or spectrograph in the case of MRS applications) based upon the received dMFS and the dDS. The magnetic field digitizer 232 and the coil signal digitizer 230 may be synchronized so that the output dMFS and the dDS may correspond with the same sampling time, sampling time period and/or sampling area (e.g., an area or point within the ROI). The reconstructor 210 may be local or remotely located relative to the wireless-type RF coil 202.

During the reconstruction, various conditions of $\vec{B}(x,y,z,t)$, where t may represent sampling time (ts) may be applied by the system to provide sufficient information for image reconstruction from acquired samples. As readily appreciated, Bloch equations may be utilized during reconstruction. In accordance with embodiments of the present system, the conditions of B are set to allow inversion of the magnetization distribution to obtain a desired resolution of a magnetization and relaxation matrix over a desired field-of-view (FOV). Because magnetic field measurements and the coil signal measurements (e.g., as represented by the MFI and the DS, respectively) are obtained using the same timing (e.g., synchronously at sampling times (ts)), this data (e.g., the MFI and the DS) may be digitized and thereafter reconstructed during the present reconstruction process without synchronization with a system clock. Reconstruction may be local within the wireless-type RF coil 202 (e.g., as shown) or the digitized data (e.g., the (e.g., the dMFS and the dDS) may transmitted to a remote location for storage and/or for further processing such as for reconstruction to reconstruct an MRI image 103 or a spectrograph.

Figure 3:
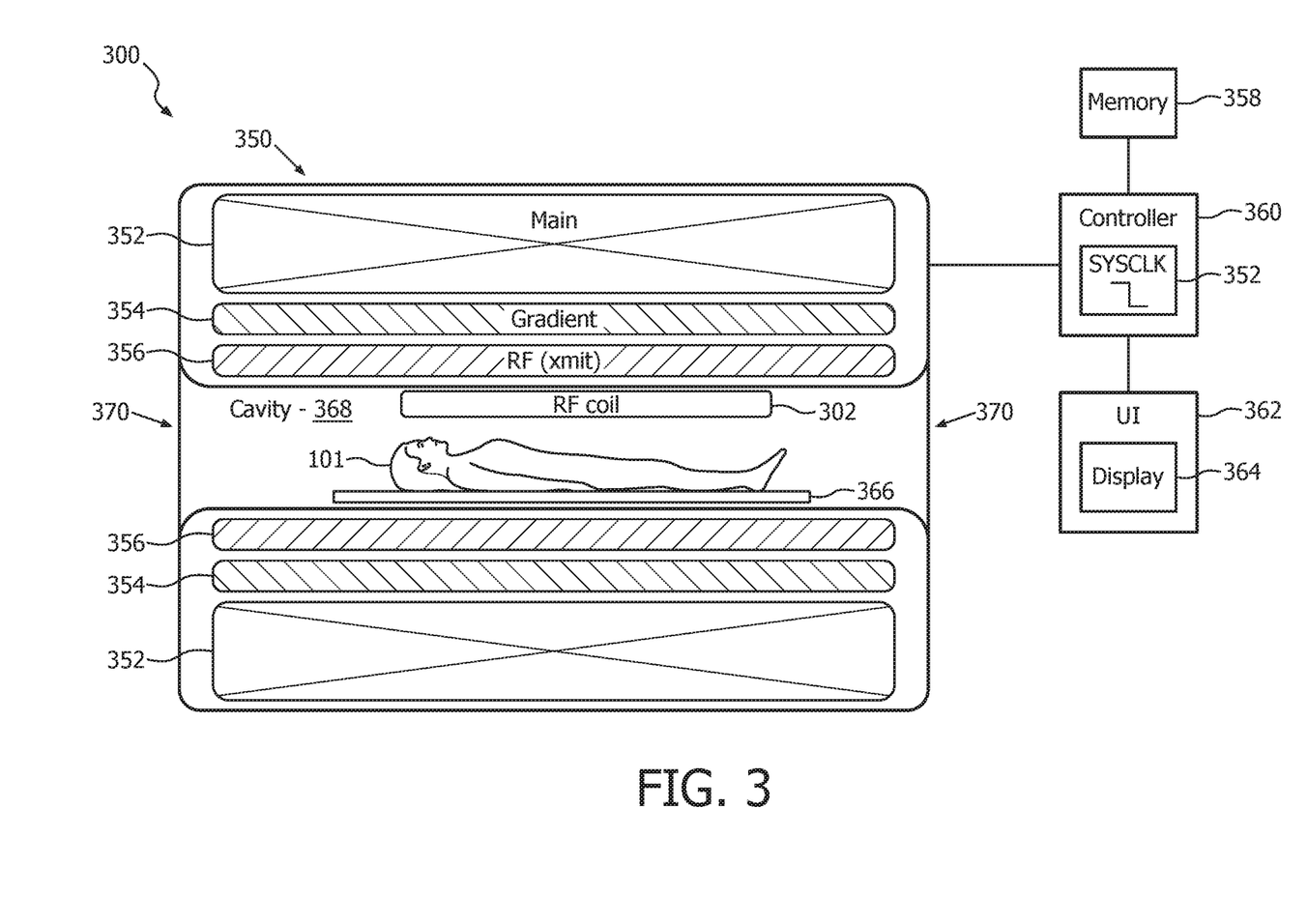
FIG. 3 shows a partially cutaway side view of a portion of an MR system operating in accordance with embodiments of the present system.

FIG. 3 shows a partially cutaway side view of a portion of an MR system 300 operating in accordance with embodiments of the present system. The MR system 300 may include one or more of a main controller 360, a memory 358, user interface (UI) 362, a housing 350, a main magnet 352, gradient coils 354, a transmit-type RF coil 356 and an receive-only-type RF coil 302. A patient support 366 may be provided to support an object-of-interest (OOI) for scanning such as a patient 101 (e.g., a human patient, etc.) and/or to position the OOI in a desired position and/or orientation under the control of the controller 360.

The housing 350 may include a main bore 368 situated between opposed ends 370 of the housing 350. Although a closed-type MR system 300 is shown, it is envisioned that the housing 350 may include closed- or open-type MRI scanning systems.

The controller 360 may control the overall operation of the MR system 300 and may include one or more logic devices such as processors (e.g., micro-processors, etc.) etc. which may process information in accordance with operating instructions and may output results of the processing. The controller 360 may include one or more of a main magnet controller, a gradient controller, an RF controller, a system clock 352, and a reconstructor.

The controller 360 may determine and/or otherwise obtain (MR) scan sequences, scan parameters, etc. from a user and/or from the memory 358 and may apply them during a scanning procedure. For example, the controller 360 may obtain a scan sequence from the memory and control, for example, main magnet 352, the gradient coils 354 and/or RF portion 356, accordingly, so as to output corresponding fields. The controller 360 may be local and/or remotely situated relative to the housing 350.

The (UI) 362 may include one or more rendering devices such as a display 364, a speaker, etc., which may render information such as content obtained by, stored by, and/or generated by the MR system 300.

The main magnet 116 be controlled to generate a main magnetic field (e.g., a $B_0$ field) within a scanning volume with the cavity 368. The main magnetic field ($B_0$) may be substantially homogenous within the scanning volume. The main magnet 352 may be an annular (e.g., ring) magnet. However, in yet other embodiments, the main magnet 352 may include any suitable magnet or magnets such as an annular or ring magnet, a planar magnet, a split magnet, an open magnet, a semicircular magnet (e.g., a C-shaped magnet, etc.

The gradient coils 354 may include one or more gradient coils (e.g., x-, y-, and z-gradient coils) which may produce one or more gradient fields (e.g., $G_x$, $G_y$, and $G_z$) along one or more corresponding axes under the control of the controller 360. The transmit-type RF coil 356 may include RF transmitters which may transmit RF signals such as an RF sequence under the controller of the controller 360.

The receive-only RF coil 302 may be a receive-only type RF portion which may be similar in operation to the RF portions 102, 202 and may operate under the control of a controller and local clock for example that is separate from the controller 360 (e.g., controller 104, 204, etc.). Diagnostic data generated by the receive-only RF coil 302 such as k-space information, raw data, reconstructed data (e.g. images, spectrographs, etc.) as discussed herein may be accessed directly, if desired, by a remote device using any suitable communication method. Accordingly, this diagnostic data may be accessed without having to access data within the memory 358 and/or interacting with the controller 360, its timing, etc.

Figure 4:
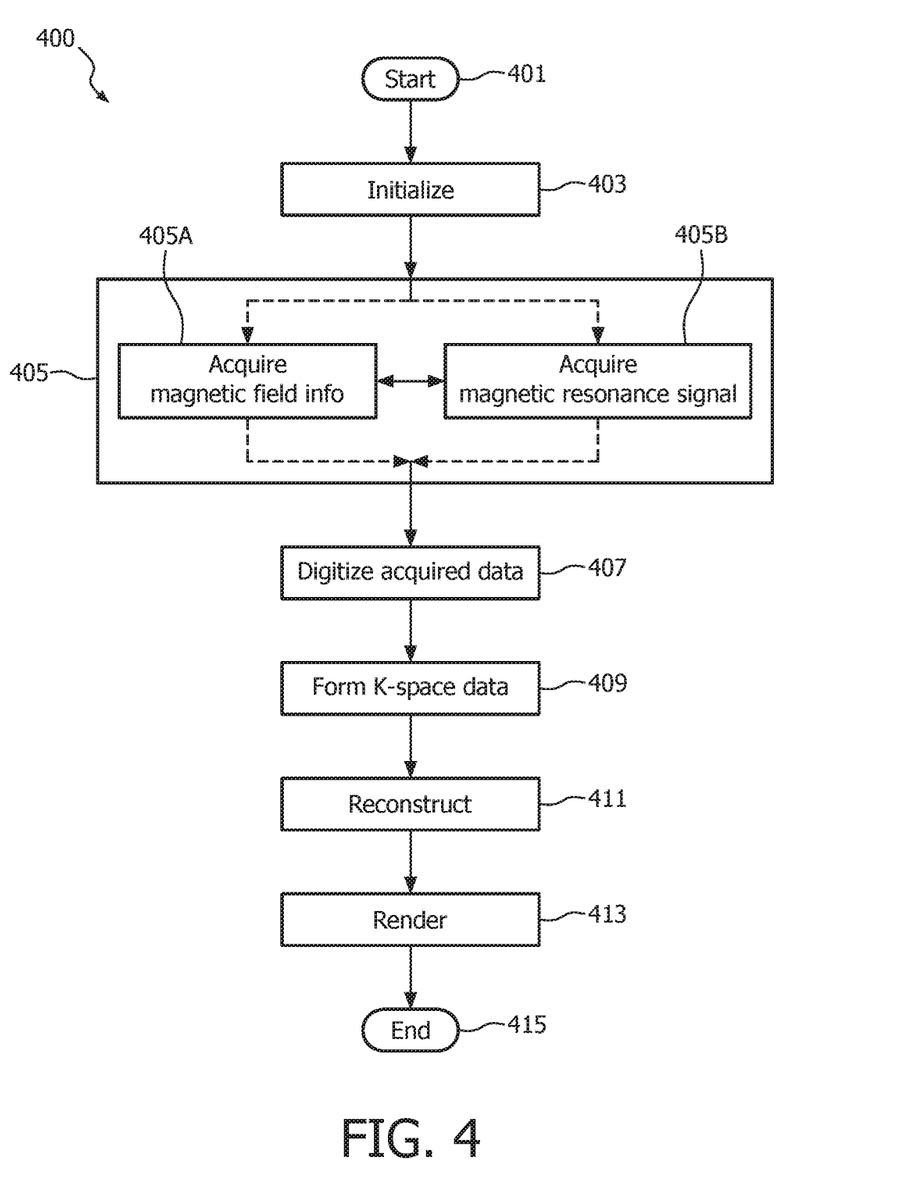
FIG. 4 shows a functional flow diagram that illustrates a scanning process performed by a read-only RF coil operating in accordance with embodiments of the present system.

FIG. 4 shows a functional flow diagram that illustrates a scanning process 400 (hereinafter the process 400) performed by a receive-only RF coil operating in accordance with embodiments of the present system. The process 400 may be performed using one or more computers communicating over a network and may obtain information from, and/or store information to one or more memories which may be local and/or remote from each other. The process 400 can include one of more of the following acts. In some embodiments, the acts of process 400 may be performed using an MRI or MRS system operating in accordance with embodiments of the present system. Further, one or more of these acts may be combined and/or separated into sub-acts, as desired. Further, one or more of these acts may be skipped depending upon settings. In operation, the process may start during act 401 and then proceed to act 403.

During act 403, the process may perform in initialization process in which the process may obtain and apply system settings (e.g., settings, parameters, etc.). For example, the process may set a sampling time (ts) from a memory of the system. After completing act 403, the process may continue to act 405.

During act 405, sub-acts 405A and 405B which may be performed synchronously, substantially synchronously and/or sequentially with regard to each other at sampling times. With reference to act 405A, during this act, the process may acquire magnetic field information signal (MFI)), encoding, etc., by sampling (e.g., at sampling times ts) magnetic field signals (MFSs) generated by sensor probes of a field sensor array. Each sample may be associated with an acquisition time or sample number. For example, each sample may be time stamped with a corresponding sampling time (ts). The sampling times may be determined based upon a local free-running clock (e.g., a clock that runs independent from a system clock such as of the MRI system). However, in yet other embodiments, it is envisioned that each sample, may be identified using an index (i), where i is an integer or may be placed in a matrix in which samples may be identified by order of acquisition. The process may obtain the MFI for each channel of a plurality of channels such as N channels, as desired.

During act 405B, the process may acquire emitted radio-frequency signals (ERFS) from a plurality of receive coils of a coil loop array. This act may occur synchronously, substantially synchronously and/or sequentially with regard to the sampling of act 405A. Thus, each time the process obtains an MFI sample, the process may sample emitted radio frequency signal (ERFS) from a plurality of coils to obtain corresponding ERFS samples. The ERFS may be identified in a similar manner to the MFI. For example, the process may associate current ERFS and MFI samples. However, in yet other embodiments, the MFI may be identified by acquisition time, sample index number (i), etc. However, in yet other embodiments, the acquired ERFS corresponding MFI samples may be acquired synchronously, substantially synchronously and/or sequentially with regard to each other and/or may be time stamped or indexed.

During act 407, the process may digitize the ERFS and MFI samples. In accordance with some embodiments, the ERFS samples may be associated with a correspondingly acquired MFI samples and one or more of the samples may be time stamped and/or indexed as described above. After completing act 407, the process may continue to act 409.

During act 409, the process may form k-space data based upon the digitized ERFS and MFI samples. The k-space data may be formed in accordance with embodiments of the present system without the need of synchronization with a system clock such as an MRI system clock. The k-space data may then be stored in a memory of the system, e.g., for later processing and/or may be transmitted for further evaluation, reconstructions, etc., as desired. After completing act 409, the process may continue to act 411.

During act 411, the process may reconstruct the k-space data to form image or spectrographic information. For example, the process may form an MRI image. The reconstruction may be performed in using any suitable method in accordance with embodiments of the present system. After completing act 411, the process may continue to act 413 where the process may render the MRI image information on UI of the system such as on a display of the system. It is also envisioned that the MRI image information may be stored in a memory of the system for later use. After completing act 413, the process may continue to act 415 where it ends.

Figure 5:
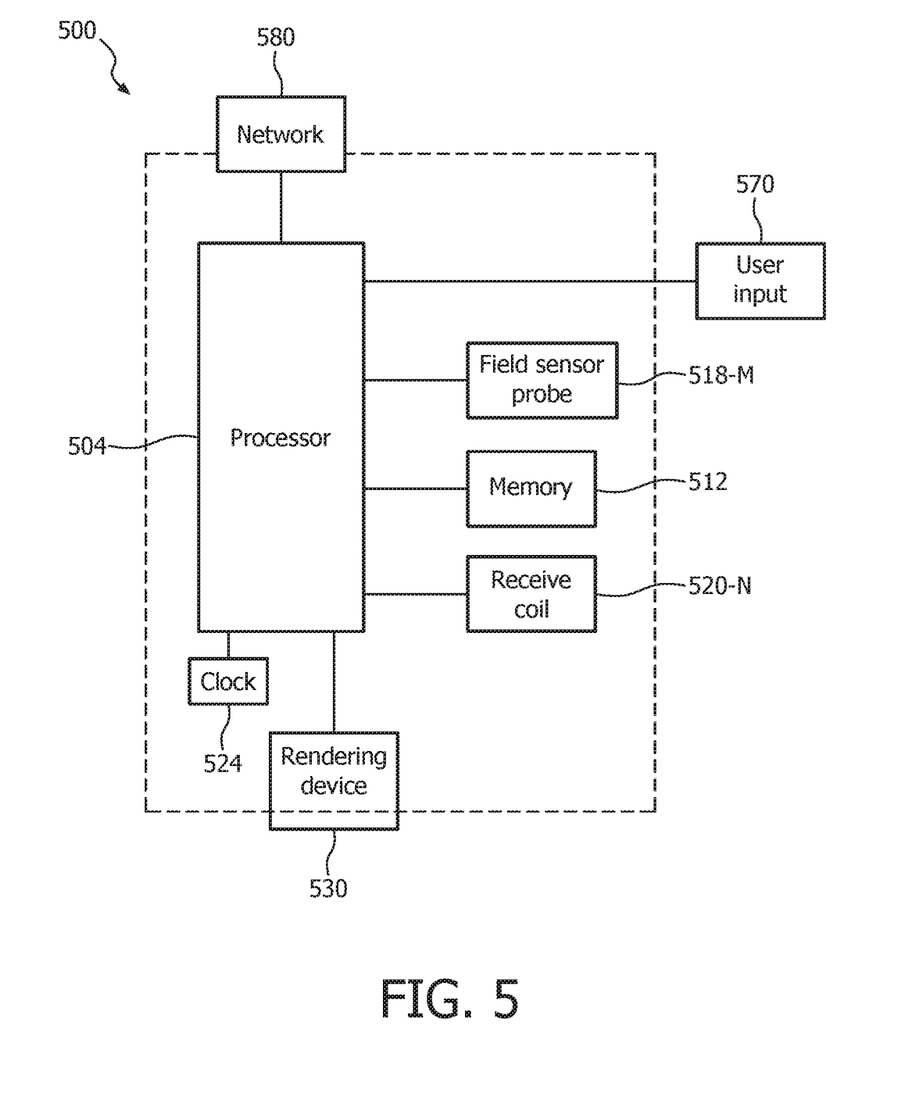
FIG. 5 shows a portion of a system in accordance with embodiments of the present system.

FIG. 5 shows a portion of a system 500 in accordance with embodiments of the present system. For example, a portion of the present system may include a processor 504 (e.g., a controller) operationally coupled to a memory 512, a rendering device such as a display 530, one or more field sensor probes 518-M, one or more receive coils 520-N, and a user input device 570. The processor 504 is responsive to a local clock 524 as described in prior embodiments including clock timing signals for controlling acquisition and time-stamping of acquired signals. The memory 512 may be any type of device for storing application data as well as other data related to the described operation. The application data and other data are received by the processor 504 for configuring (e.g., programming) the processor 504 to perform operation acts in accordance with the present system. The processor 504 so configured becomes a special purpose machine particularly suited for performing in accordance with embodiments of the present system.

The operation acts may include configuring a system such as a coil system as described herein. For example, the controller may be configured to operate as one or more of the receiver, reconstructor, etc. as described herein. In accordance with one or more embodiments of the present system, the one or more of the operations such as one or more of the receiver, reconstructor, etc., may be provided by a separate portion, such as shown in FIG. 1. In these embodiments, the processor 504 may be so configured (e.g., programmed from a preprogrammed state and/or otherwise structured) to operate and interact with these portions.

For example, the processor 504 may be programmed to operate as a reconstructor to process received information such k-space information and transform the k-space information (e.g., using one or more reconstruction techniques of embodiments of the present system) into content which may include image information (e.g., still or video images (e.g., video information)), data, and/or graphs that can be rendered on, for example, a user interface (UI) of the present system such as on the display 530, a speaker, etc. Further, the content may then be stored in a memory of the system such as the memory 512 for later use. Thus, operation acts may include receiving and/or rendering of content such as, for example, reconstructed image information obtained from the k-space information. The processor 504 may render the content such as video information on a UI of the system such as a display of the system.

The user input 570 may include a keyboard, a mouse, a trackball, or other device, such as a touch-sensitive display, which may be stand alone or be a part of a system, such as part of a personal computer, a personal digital assistant (PDA), a mobile phone (e.g., a smart phone), a monitor, a smart- or dumb-terminal or other device for communicating with the processor 504 via any operable link. The user input device 570 may be operable for interacting with the processor 504 including enabling interaction within a UI as described herein. Clearly the processor 504, the memory 512, display 530, and/or user input device 570 may all or partly be a portion of a computer system or other device such as a client and/or server.

The methods of the present system are particularly suited to be carried out by a computer software program, such program containing modules corresponding to one or more of the individual steps or acts described and/or envisioned by the present system. Such program may of course be embodied in a computer-readable medium, such as an integrated chip, a peripheral device or memory, such as the memory 520 or other memory coupled to the processor 504 such as via a network 580.

The program and/or program portions contained in the memory 512 may configure the processor 504 to implement the methods, operational acts, and functions disclosed herein. The memories may be distributed, for example between the clients and/or servers, or local, and the processor 504, where additional processors may be provided, may also be distributed or may be singular. The memories may be implemented as electrical, magnetic or optical memory, or any combination of these or other types of storage devices. Moreover, the term "memory" should be construed broadly enough to encompass any information able to be read from or written to an address in an addressable space accessible by the processor 504. With this definition, information accessible through a network is still within the memory, for instance, because the processor 504 may retrieve the information from the network for operation in accordance with the present system.

The processor 504 is operable for providing control signals and/or performing operations in response to input signals from the user input device 570 as well as in response to other devices of a network and executing instructions stored in the memory 512. The processor 504 may include one or more of a microprocessor, an application-specific or general-use integrated circuit(s), a logic device, etc. Further, the processor 504 may be a dedicated processor for performing in accordance with the present system or may be a general-purpose processor wherein only one of many programmed functions operates for performing in accordance with the present system. The processor 504 may operate utilizing a program portion, multiple program segments, or may be a hardware device utilizing a dedicated or multi-purpose integrated circuit. Embodiments of the present system may provide fast imaging methods to acquire and reconstruct images independent of an MRI system that may be utilized for originating MRI signals. Suitable applications may include imaging systems such as MRI and MRS systems.

Embodiments of the present system may provide a wireless-type receiving system and method for signal acquisition and reconstruction which may obviate the need for clock synchronization in wireless-type receiving system such as wireless-type coils. Accordingly, embodiments of the present system may obviate the need for RF cables as well as synchronization cables when using RF coils in an MRI system. Further, the receive-only RF coil in accordance with embodiments of the present system may be utilized to reconstruct image information internally so that the image information may be available to a user by the RF portion rather than from and through the MRI system. Further, embodiments of the present system enable the use of acquired data (e.g., MRs and MFI) directly without reference to the system clock or system parameters. Further, as embodiments of the present system may not have to communicate with a MR system controller, they may run independently of the MR system. Accordingly, scan results (e.g., MRI image information, k-space information, etc.) acquired during a scan may be accessed and/or processed independently of the MR system. Accordingly, access fees to access data on the MRI system may be eliminated. This may save costs and may allow cross-platform mobility and/or interoperability.

Thus, embodiments of the present system provide a system and method in which clock synchronization of a wireless-type RF coil with a system clock may be rendered unnecessary. Although embodiments of the present system were described with reference to MRI systems, it should be understood that embodiments of the present system should not be limited to MRI systems and may encompass MRS systems and the like.

Further, by using wireless-type RF coils, galvanic cables for DC power and RF transmission are not required. This can prevent exposure of a patient to SAR due to RF emissions from the galvanic cables and may reduce patient SAR exposure when compared to conventional RF coils which use galvanic cables for power and/or RF communication. Additionally, ergonomics and aesthetics are enhanced as the use of bulky galvanic cables coupled to the RF portion can be avoided. Moreover, signal losses associated with long runs of the galvanic cables can be prevented which can result in improved image quality as digital image information may be generated by the RF portion and wirelessly transmitted as digitized information to a controller of the system for further processing, storage, and/or rendering on a display of the system. Further, as the RF portion may be a wireless stand-alone unit, aesthetics and handling of the RF portion can be improved.

Accordingly, embodiments of the present system provide for the integration of local acquisition of data such as the measurement of all dynamic encoding functions and signal acquisition which may provide for reconstruction of the acquired data independent of a system which generated these encoding functions. Embodiments of the present system may provide a module which may provide for RF signal acquisition, RF field generation acquisition, and gradient field generation acquisition, all clocked from the same local clock as opposed to a being synchronized to a system clock. Accordingly, these signals may be acquired at given signal samplings location(s) and may be interpolated for other locations as desired. Embodiments of the present system may, then use the determined field measurements to generate data such as k-space data and/or reconstruct data such as images, spectrographs, etc. entirely without dependence upon the MR system which generated the encoding functions (e.g., generated the gradient, RF fields, etc.). Further, by keeping information in the RF coil, the owner of the RF coil may own the diagnostic data as opposed to the owner of the MRI system. Accordingly, RF coils in accordance with embodiments of the present system may be fully autonomous and a local MRI system may not need to be the reconstructor or sole reconstructor of acquired information.

In accordance with embodiments of the present system, there is provided a k-space state machine which may employ a local full spectrometer for use with nuclei of the probes (e.g., NMR probes which may detect magnetic field information) selected for use in an MRI (or MRS) environment. This spectrometer in accordance with embodiments of the present system may perform a nearly constant acquisition of fields within the environment which acquisition may provide for real-time (or substantially real-time) evaluation of a low frequency (gradient) and RF frequency magnetic fields that are locally occurring in a vicinity of RF receiver coils (e.g., RF surface coils) operating in accordance with embodiments of the present system. The probes for the spectrometer may be distributed around and/or about the RF coils which may acquire RF signals emitted from an OOI being scanned (e.g., a tissue of a patient) using MR methods. These probes may then simultaneously acquired field data (e.g., encoding functions) as the encoded RF signals (e.g., encoding signals) are being acquired. The acquired field data and the acquired RF signals may be used to provide for a full estimation of the dynamic encoding fields with sufficient resolution to reconstruct images (e.g., MRI images) solely from this information. Digital receivers, such as a 4 channel digitizer receiver operating in accordance with embodiments of the present system may acquire emitted RF signals such as RF spin signals whereas the signals received from the (NMR) field probes may be acquired with the same, or other receivers. Since the encoding functions and encoded signals are both acquired, processing may occur locally within the RF coil operating in accordance with embodiments of the present system or both sets of signals may be transmitted (e.g., wirelessly) to a processor such as a user's computer or a controller of an MRI system for reconstruction, display and other processing.

While the present invention has been shown and described with reference to particular exemplary embodiments, it will be understood by those skilled in the art that present invention is not limited thereto, but that various changes in form and details, including the combination of various features and embodiments, may be made therein without departing from the spirit and scope of the invention. The above-discussion is intended to be merely illustrative of the present system and should not be construed as limiting the appended claims to any particular embodiment or group of embodiments. Thus, while the present system has been described with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

In interpreting the appended claims, it should be understood that:

a) the word "comprising" does not exclude the presence of other elements or acts than those listed in a given claim;

b) the word "a" or "an" preceding an element does not exclude the presence of a plurality of such elements;

c) any reference signs in the claims do not limit their scope;

d) several "means" may be represented by the same item or hardware or software implemented structure or function;

e) any of the disclosed elements may be comprised of hardware portions (e.g., including discrete and integrated electronic circuitry), software portions (e.g., computer programming), and any combination thereof;

f) hardware portions may be comprised of one or both of analog and digital portions;

g) any of the disclosed devices or portions thereof may be combined together or separated into further portions unless specifically stated otherwise;

h) each of these disclosed devices, portions thereof and/or combinations thereof should be understood to be a separate embodiment that is operable separately from any other embodiments and/or combinations thereof;

i) no specific sequence of acts or steps is intended to be required unless specifically indicated;

j) the term "plurality of" an element includes two or more of the claimed element, and does not imply any particular range of number of elements; that is, a plurality of elements may be as few as two elements, and may include an immeasurable number of elements; and k) the term and/or and formatives thereof should be understood to mean that only one or more of the listed elements may need to be suitably present in the system in accordance with the claims recitation and in accordance with one or more embodiments of the present system.

The invention claimed is:

1. A wireless-type radio frequency (RF) coil apparatus for a magnetic resonance (MR) system including a system clock, the wireless-type RF coil apparatus comprising:

an RF transducer array, comprising a plurality of coils tuned to acquire emitted RF signals from an object of interest (OOI) within a scanning volume of the MR system when subject to MR encoding signals;

a magnetic field sensor array comprising a plurality of field sensor probes tuned to acquire a magnetic field when subject to dynamic encoding fields within the scanning volume;

a local clock configured to produce a local clock signal without synchronization with the system clock; and at least one controller programmed to execute a process comprising:

acquiring detected RF signals generated by the plurality of coils of the RF transducer array corresponding to the emitted RF signals, first indications of the local clock signal indicating times of acquiring the detected RF signals, acquiring magnetic field strength signals generated by the plurality of field sensor probes of the magnetic field sensor array corresponding to the magnetic field, second indications of the local clock signal indicating times of acquiring the magnetic field strength signals, and forming k-space information based upon the acquired detected RF signals, the acquired magnetic field strength signals, and the first and second indications of the local clock signal.

2. The apparatus of claim 1, wherein the at least one controller forms the k-space information utilizing the first and second indications of the local clock signal.

3. The apparatus of claim 1, wherein the at least one controller reconstructs an image based upon the k-space information.

4. The apparatus of claim 1, wherein the at least one controller repeatedly performs the acquisitions of the detected RF signals and the magnetic field strength signals at sampling times (ts) of the local clock, respectively.

5. The apparatus of claim 1, wherein prior to forming the k-space information, the at least one controller digitizes the acquired detected RF signals and the acquired magnetic field strength signals.

6. The apparatus of claim 1, wherein when forming the k-space information, the at least one controller determines encoding functions of the MR system based upon the acquired magnetic field strength signals.

7. The apparatus of claim 6, wherein the at least one controller time-stamps the digitized acquired magnetic field strength signals using the local clock signal.

8. The apparatus of claim 1, wherein the plurality of field sensor probes are situated in substantially close proximity to the RF transducer array.

9. The apparatus of claim 1, wherein the plurality of field sensor probes surround the RF transducer array.

10. A method of controlling a wireless-type radio frequency (RF) coil apparatus for a magnetic resonance (MR) system including a system clock, the method comprising:
  acquiring detected RF signals generated by a plurality of receive coils of an RF transducer array, and first indications of a local clock signal, generated by a local clock not synchronized with the system clock, indicating times of acquiring the detected RF signals;
  acquiring magnetic field strength signals generated by a plurality of field sensor probes of a magnetic field array, and second indications of the local clock signal indicating times of acquiring the magnetic field strength signals; and
  forming k-space information based upon the acquired detected RF signals, the acquired magnetic field strength signals, and the first and second indications of the local clock signal.

11. The method of claim 10, further comprising reconstructing an image based upon the k-space information.

12. The method of claim 10, further comprising repeatedly performing the acquisitions of the detected RF signals and the magnetic field strength signals at sampling times (ts) of the local clock.

13. The method of claim 10, further comprising digitizing the acquired detected RF signals and the acquired magnetic field strength signals prior to forming the k-space information.

14. The method of claim 13, further comprising time-stamping the digitized acquired magnetic field strength signals.

15. The method of claim 10, wherein forming the k-space information comprises determining encoding functions of the MR system based upon the acquired magnetic field strength signals.

16. The method of claim 10, further comprising positioning the plurality of field sensor probes in substantially close proximity to the RF transducer array.

17. The method of claim 10, further comprising positioning the plurality of field sensor probes to surround the RF transducer array.

18. A computer readable non-transitory medium having storing computer readable program code for operating on a wireless-type radio frequency (RF) coil apparatus of magnetic resonance (MR) system, when executed by a computer processor, the computer readable program code causing the RF coil apparatus to perform a method comprising:
  acquiring detected RF signals generated by a plurality of receive coils of an RF transducer array, and first indications of a local clock signal, generated by a local clock not synchronized with a system clock of the MR system, indicating times of acquiring the detected RF signals;
  acquiring magnetic field strength signals from a plurality of field sensor probes of a magnetic field sensor array, and second indications of the local clock signal indicating times of acquiring the magnetic field strength signals; and
  forming k-space information based upon the acquired detected RF signals, the acquired magnetic field strength signals, and the first and second indications of the local clock signal.

* * * * *